United States Patent [19]
Moon

[11] Patent Number: 6,091,091
[45] Date of Patent: *Jul. 18, 2000

[54] CHARGE-COUPLED IMAGE DEVICE

[75] Inventor: Shang Ho Moon, Seoul, Rep. of Korea

[73] Assignee: LG Semicon Co., Ltd., Chungcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/856,484

[22] Filed: May 14, 1997

[30] Foreign Application Priority Data

Jun. 10, 1996 [KR] Rep. of Korea ............... 96/20660

[51] Int. Cl.⁷ ............... H01L 27/148; H01L 29/768
[52] U.S. Cl. ............... 257/233; 257/222
[58] Field of Search ............... 257/222, 232, 257/233

[56] References Cited

U.S. PATENT DOCUMENTS

| | | | |
|---|---|---|---|
| 4,521,797 | 6/1985 | Oda | 257/233 |
| 4,935,794 | 6/1990 | Miyatake | 257/232 |
| 5,243,180 | 9/1993 | Nam | 257/233 |
| 5,286,988 | 2/1994 | Nishi | 257/233 |
| 5,313,081 | 5/1994 | Yamada | 257/222 |

OTHER PUBLICATIONS

Junichi Hojo et al., "A 1/3–in 510(H)×492 (V) CCD Image Sensor with Mirror Image Function", IEEE Transactions on Electron Devices, vol. 38, No. 5, May 1991, pp. 954–956.

*Primary Examiner*—Gene M. Munson
*Attorney, Agent, or Firm*—Morgan, Lewis & Bockius LLP

[57] ABSTRACT

A CCD image device in which the potential variation of a charge transferring region caused by a CST layer is minimized to enhance the charge transfer efficiency, is disclosed including a plurality of photo-detectors arranged regularly in row and column directions in the surface of a substrate of a first conductivity type; a plurality of charge transferring regions of a second conductivity type formed between the photo-detectors of the row direction; and a channel stop layer formed in the surface of the substrate in order to electrically insulate the respective photo-detectors and the respective charge transferring regions from each other. A CST doping concentration reducing region for decreasing the doping concentration of the channel stop layer is formed at least one in each part to which the neighboring two photo-detectors are adjacent.

9 Claims, 7 Drawing Sheets

CHARGE-COUPLED IMAGE DEVICE

BACKGROUND OF THE INVENTION

The present invention relates to a charge-coupled device (CCD), and more particularly, to a CCD image device for enhancing a charge transfer efficiency by minimizing the potential variation of a charge transfer region, which is generated by a channel stop layer (CST) layer.

In general, a CCD is composed of a plurality of photoelectric converting regions for converting the image of light into an electrical signal, a plurality of vertical charge-coupled device (VCCD) region for transferring the image charge generated from the photoelectric converting region in a vertical direction, a horizontal charge-coupled device (HCCD) region for transferring the image charge transferred vertically through the VCCD region in a horizontal direction, and a sensing amp for sensing the image charge transferred horizontally through the HCCD region and transferring the sensed image charge to an external peripheral circuit.

Between each photoelectric converting region and each charge transferring region, in order to prevent the image charge from overflowing into the neighboring pixel and channel, a channel stop layer (CST layer) is formed by ion-implanting a high concentration impurity of a conductivity type opposite to that of a substrate.

Hereinafter, a conventional CCD image device will be described with reference to the attached drawings.

FIG. 1 is a layout diagram of the conventional CCD image device. FIGS. 2a and 2b show vertical potential profiles of the CCD image device of FIG. 1. FIG. 3 show a horizontal potential profile of the CCD image device of FIG. 1.

As shown in FIG. 1, the conventional CCD image device comprises a plurality of photodiode regions 1 arranged with a matrix type and converting the image signal of light into an electrical signal, a plurality of vertical charge-coupled device (VCCD) regions 2 formed vertically between the photodiode regions 1 and transferring the image charge generated from photodiode regions 1 in a vertical direction, and a channel stop layer 3 formed between each photodiode region 1 and each VCCD region 2 and preventing the generated signal charge from overflowing into the neighboring pixel.

Photodiode region 1 arranged regularly as described above generate the signal charge according to the wavelength and intensity of the received light.

The signal charge is transferred to VCCD region 2 and transferred vertically in one direction (y-direction of FIG. 1).

The potential profile of the conventional CCD image device will be described below.

Channel stop layer 3 is formed so as to surround photodiode region 1 at a regular interval of "a". This is because the variation and influence of the potential profile by channel stop layer 3 is minimized so that the charge transferring is attained smoothly.

Considering the characteristics of the device, it is possible to form channel stop layer 3 by voluntarily changing the width thereof. Undoubtedly, the width should be the same on the whole.

However, comparing FIG. 2A and FIG. 2b, channel stop layer 3 is formed with a T-shape in the "α" part on the layout, so that it is formed by a space larger than "a" in a horizontal direction. Accordingly, the ion implantation concentration is higher than that of channel stop layer 3 excluding the "α" part".

That is, even if the space of channel stop layer 3 is formed uniformly, the potential profile becomes different in the intersection part of channel stop layer 3 (d1>d2).

That is, in the α" part, there occurs an effect that the ion implantation concentration is increased. Accordingly, the "n" region of photodiode region 1 and the "n" region of VCCD region 2 become narrower in effect.

The horizontal potential profile of the CCD image device of FIG. 1 is shown in FIG. 3.

The difference of the potential caused due to the channel stop layer is little worth consideration in a general camera system.

However, in a system such as a HDTV noticed as the next generation television form, a charge-coupled device more than 200 myriad pixel is necessary, and the charge transfer efficiency attended thereby is required.

Accordingly, the conventional CCD image device having the aforementioned structure requires the improvement of the structure thereof by the following problems.

Referring to FIG. 3, due to the influence of the channel stop layer, the potential distribution of the VCCD narrows in the "α" part and widen in the part excluding the "α" part.

Accordingly, first, since the potential distribution of the VCCD is not uniform, the charge transfer efficiency becomes lower when transferring the signal charge.

Secondly, the "p" region of the channel stop layer encroaches on the "n" region of the photodiode region and the "n" region of the VCCD region, thereby reducing the area of the entire light-receiving region and the transfer channel region. Accordingly, it is much disadvantageous to the miniature and high integration of a chip. This is because, as the size of the device becomes smaller and the integrating thereof becomes higher, the ununiformness of the potential distribution in the transfer channel is a main factor of deteriorating the device characteristics.

SUMMARY OF THE INVENTION

In order to solve the aforementioned problems of the conventional CCD image device, it is an object of the present invention to provide a CCD image device in which the potential variation of the peripheral region caused by the CST layer is minimized to thereby enhance the charge transfer efficiency.

To accomplish the object of the present invention, there is provided a CCD image device comprising a plurality of photo-detectors formed so as to be arranged regularly in row and column directions in the surface of a substrate of a first conductivity type; a plurality of charge transferring regions of a second conductivity type formed between the photo-detectors of the row direction; and a channel stop layer formed in the surface of the substrate in order to electrically insulate the respective photo-detectors and the respective charge transferring regions from each other, wherein a CST doping concentration reducing region for decreasing the doping concentration of the channel stop layer is formed at least one in each part to which the neighboring two photo-detectors are adjacent.

BRIEF DESCRIPTION OF THE ATTACHED DRAWINGS

DETAILED DESCRIPTION OF THE INVENTION

Hereinafter, a CCD image device of the present invention will be described with reference to the attached drawings.

Figure 1:
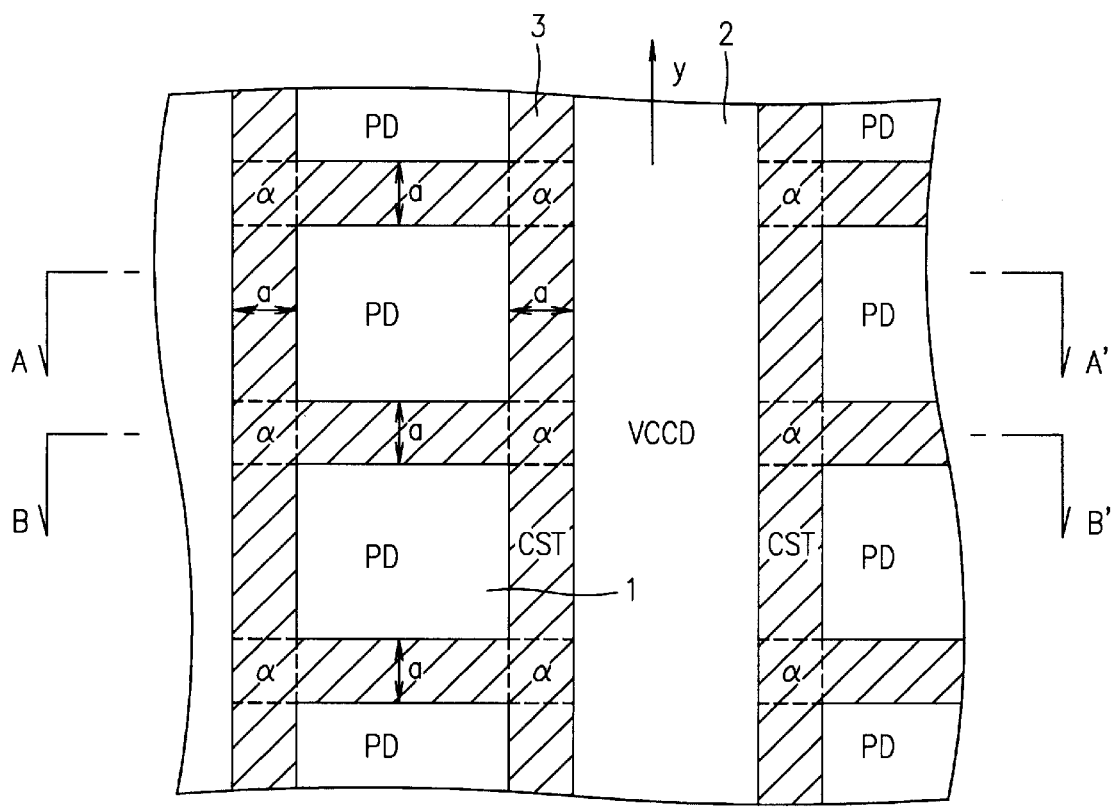
FIG. 1 is a layout diagram of a conventional CCD image device.
Figure 2A:
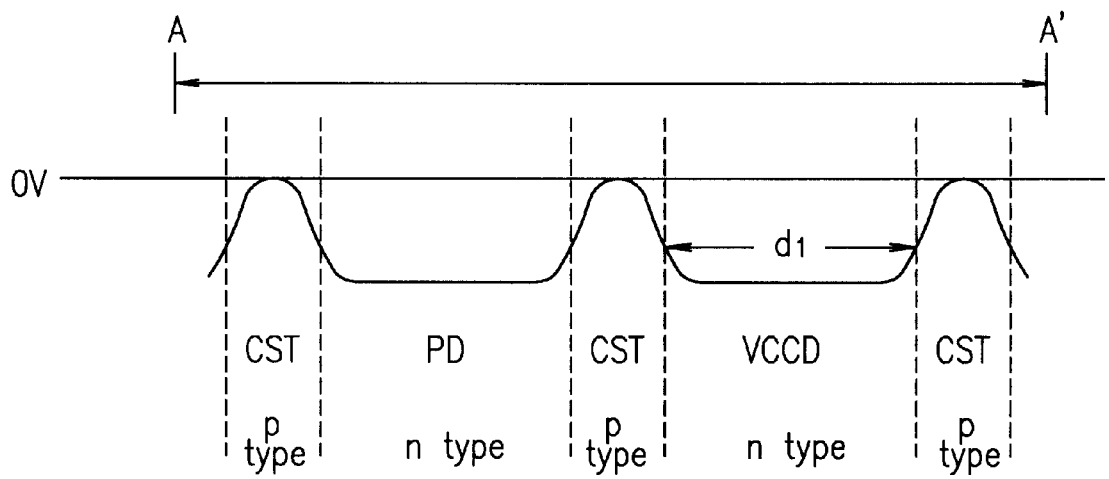
FIGS. 2a and 2b show vertical potential profiles of the CCD image device of FIG. 1.
Figure 2B:
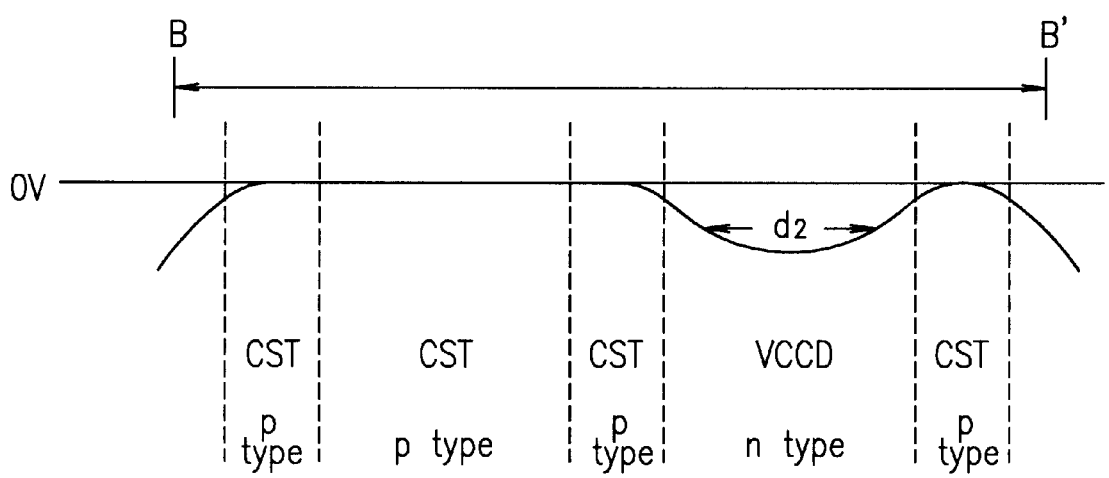
Figure 3:
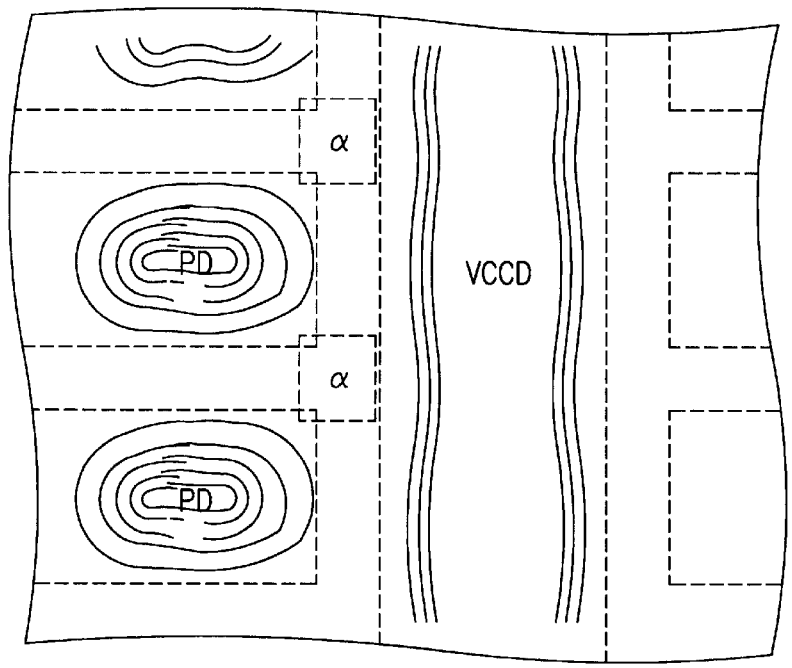
FIG. 3 shows a horizontal potential profile of the CCD image device of FIG. 1.
Figure 4:
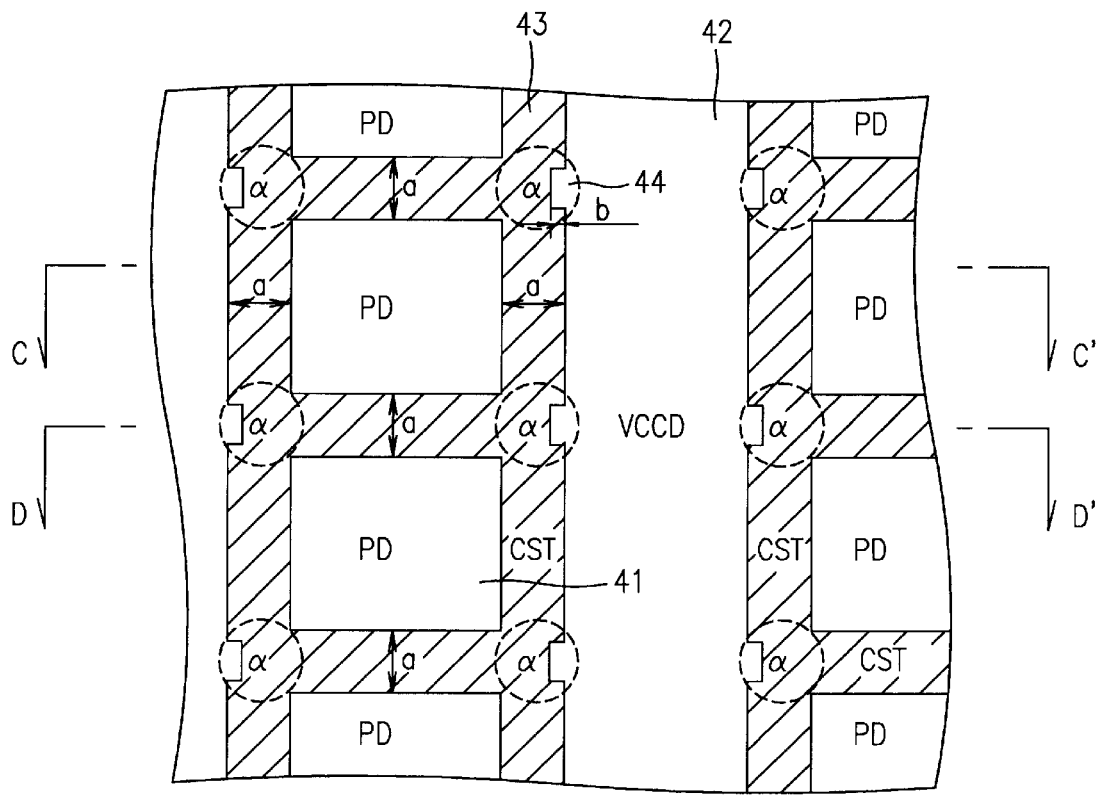
FIG. 4 is a layout diagram of a CCD image device according to the present invention.

FIG. 4 is a layout diagram of a CCD image device of the present invention.

The CCD image device of the present invention comprises a plurality of photodiode regions 41 arranged with a matrix type and converting the image signal of light into an electrical signal, a plurality of vertical charge-coupled device (VCCD) regions 42 formed vertically between the photodiode regions 41 and transferring the image charge generated from photodiode regions 41 in a vertical direction, and a channel stop layer 43 formed between each photodiode region 41 and each VCCD region 42 and preventing the generated signal charge from overflowing into the neighboring pixel and thus, mixing.

At this time, by implanting no ion for forming channel stop layer 43 or by implanting an ion of an opposite conductivity type, channel stop layer 43 is formed so as to have a CST doping concentration reducing region 44 for decreasing the doping concentration of channel stop layer 43 in a specific part ($\alpha$ part).

That is, in the intersection part of channel stop layer 43 (i.e., the part to which three regions of the neighboring two photodiode regions and the VCCD region are adjacent), the ion-implanted region is formed to a narrow width ("b" in FIG. 4). In the other part, channel stop layer 43 is formed to the same width ("a" in FIG. 4), so that the potential distribution becomes uniform in effect.

At this time, a method of forming channel stop layer 43 by partially reducing is as follows.

To begin with, there is a method where no ion implantation is carried out in the $\alpha$ part when performing an ion implantation for forming channel stop layer 43.

As another method, there is a method where the ion implanted region for forming channel stop layer 43 and the ion implanted region for forming photodiode region 41 are overlapped partially (only in the $\alpha$ part) to cause a counter doping phenomenon, thereby decreasing the doping concentration of the $\alpha$ part.

There is further another method where an ion is implanted in the $\alpha$ part of channel stop layer 43 in order to form VCCD region 42.

As described above, the CCD image device of the present invention generates the signal charge according to the wavelength and intensity of the light received in photodiode region 41.

The signal charge is transferred to VCCD region 42 and thus, transferred vertically in one direction.

At this time, in order to know the potential state in VCCD region 42 under the charge transfer operation, the potential profile of the CCD image device of the present invention will be described below.

Figure 5A:
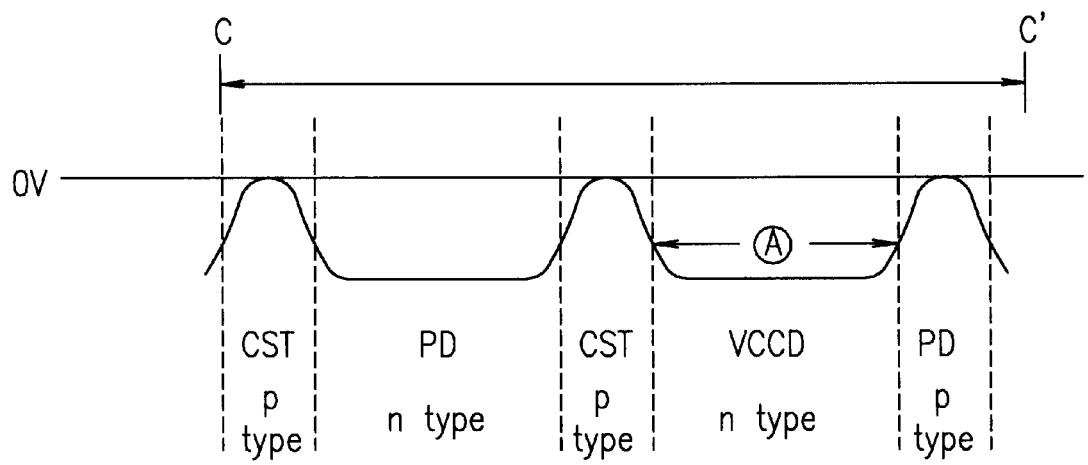
FIGS. 5a and 5b show vertical potential profiles of the CCD image device of FIG. 4.
Figure 5B:
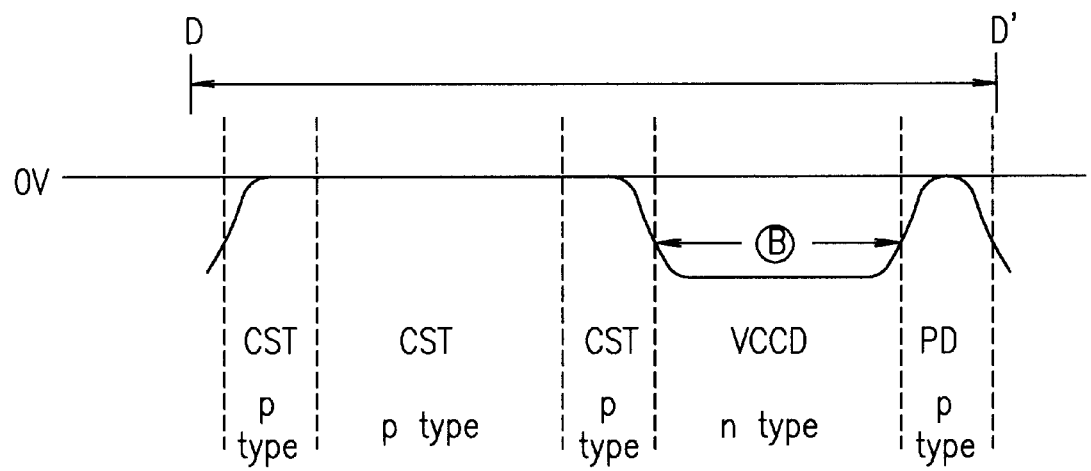
Figure 6:
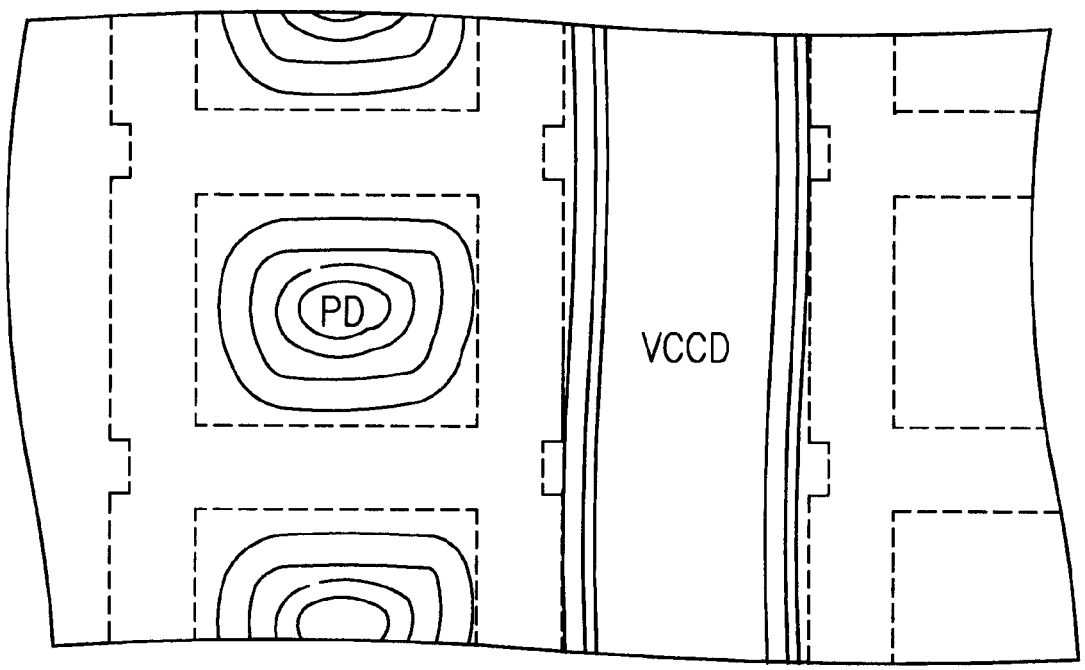
FIG. 6 shows a horizontal potential profile of the CCD image device of FIG. 4.

FIGS. 5a and 5b show vertical potential profiles of the CCD image device of FIG. 4. FIG. 6 shows a horizontal potential profile of the CCD image device of FIG. 4.

In the CCD image device of the present invention, as shown in FIGS. 5a and 5b, the potential profiles of the part where channel stop region 43 cross and the part excepting it are uniform (a=b). This is because the impurity doping concentration of channel stop layer 43 was high partially, so that CST doping concentration reducing region 44 for decreasing the doping concentration in the part where the potential profile is not uniform (i.e., the $\alpha$ part) was formed at least one.

Accordingly, as shown in FIG. 6, the potential profile in the VCCD region is distributed uniformly.

As described above, it is possible to blank the ion implanted region of the intersection part, without varying the width of the intersection part of the channel stop layer to unify the potential distribution.

A CCD image device according to another embodiment of the present invention in which the blank region is formed in the $\alpha$ part to decrease the doping concentration of channel stop layer 43, will be described below.

Figure 7A:
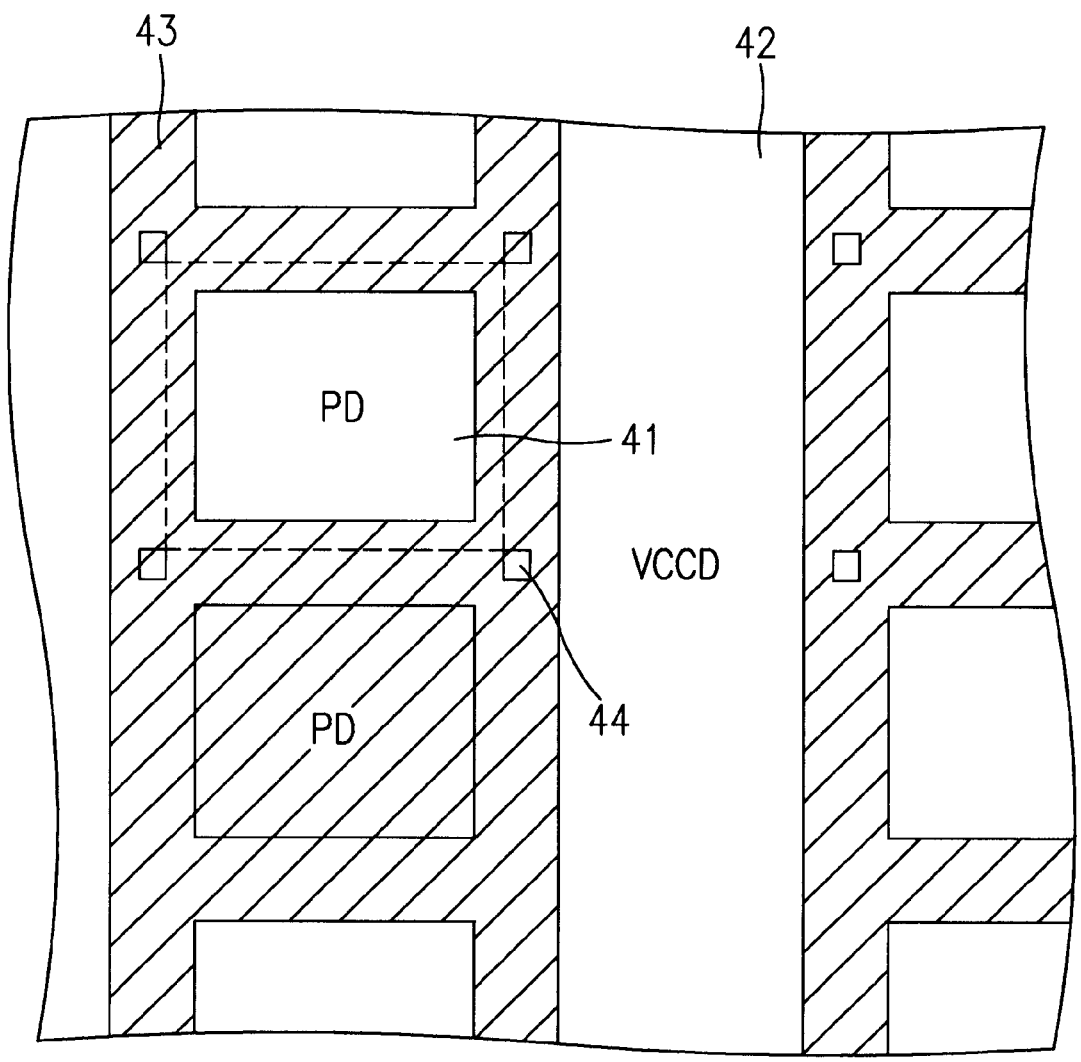
FIGS. 7a and 7b are layout diagrams of a CCD image device according to another embodiment of the present invention.
Figure 7B:
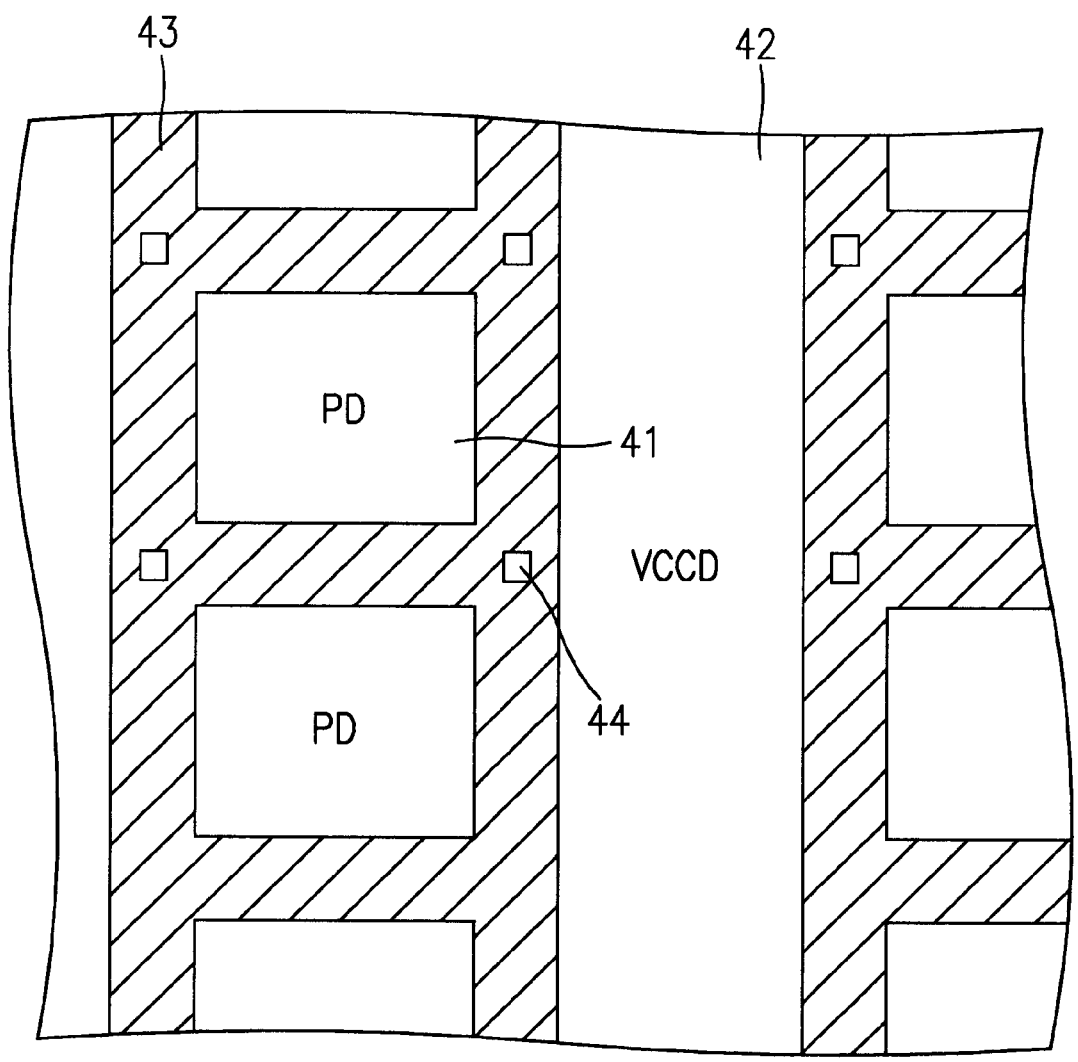

FIGS. 7a and 7b are layout diagrams of a CCD image device according to another embodiment of the present invention.

To begin with, in FIG. 7a, an n-type impurity implanted region for forming photodiode region 41 is enlarged. When implanting an ion for forming channel stop layer 43, a certain specific region of the a part is blanked to thereby decrease the impurity doping concentration of channel stop layer 43.

In FIG. 7b, the impurity implanted region for forming photodiode region 41 is left just as it is. The ion implantation for forming channel stop layer 43 is not performed in a predetermined region of the $\alpha$ part, thereby decreasing the impurity doping concentration of channel stop layer 43.

As described above, in the CCD image device of the present invention, the CST doping concentration reducing region is formed in the a part where the doping concentration of the channel stop layer crowds, thereby minimizing the potential variation caused by the channel stop layer applied to the charge transferring region and the light-receiving region. Accordingly, the charge transfer efficiency is increased to thereby enhance the sensitivity of the device.

What is claimed is:

1. A charge coupled image device comprising:

a plurality of photo-detectors arranged regularly in row and column directions in a surface of a substrate of a first conductivity type;

a plurality of charge transferring regions of a second conductivity type formed between the photo-detectors of the row direction;

a channel stop layer formed in the surface of the substrate to electrically insulate the photo-detectors from corresponding charge transferring regions; and a reduced doping concentration region formed in the channel stop layer near two adjacent photo-detectors, wherein the reduced doping concentration region is formed in a boundary between the charge transferring region and the channel stop layer to reduce a width of the channel stop layer, and wherein an impurity of the first conductivity type for forming the channel stop layer and an impurity of the second conductivity type for forming the charge transferring region are both implanted in the reduced doping concentration region, so that a potential level of the reduced doping concentration region is lower than a potential level of the channel stop layer.

2. A charge coupled image device comprising:

a plurality of photo-detectors arranged regularly in row and column directions in a surface of a substrate of a first conductivity type;

a plurality of charge transferring regions of a second conductivity type formed between the photo-detectors of the row direction;

a channel stop layer formed in the surface of the substrate to electrically insulate the photo-detectors from corresponding charge transferring regions; and a reduced doping concentration region formed in the channel stop layer near two adjacent photo-detectors, wherein the reduced doping concentration region is formed in a boundary between the charge transferring region and the channel stop layer to reduce a width of the channel stop layer, and wherein only an impurity of the second conductivity type for forming the charge transferring region is implanted in the reduced doping concentration region, so that the reduced doping concentration region can function as the charge transferring region.

3. A charge coupled image device (CCD) comprising:

a plurality of photo-detectors arranged regularly in row and column directions in a surface of a substrate of a first conductivity type;

a plurality of charge transferring regions of a second conductivity type formed between the photo-detectors of the row direction;

a channel stop layer formed in the surface of the substrate to electrically insulate the photo-detectors from corresponding charge transferring regions; and a reduced doping concentration region formed in the channel stop layer approximately equidistant from two adjacent photo-detectors and laterally offset from the two adjacent photo-detectors, wherein the reduced doping concentration region is formed as an extension of at least one of the plurality of charge transferring regions.

4. The CCD as claimed in claim 3, wherein an impurity of the second conductivity type for forming the photo-detectors is implanted in the reduced doping concentration region, so that a potential level of the photo-detectors is lower than a potential level of the channel stop layer.

5. The CCD as claimed in claim 3, wherein no impurities are implanted in the reduced doping concentration region, so that a potential level of the photo-detector is lower than a potential level of the channel stop layer.

6. The CCD as claimed in claim 3, wherein the reduced doping concentration region is completely surrounded by the channel stop region.

7. A charge coupled image device (CCD) comprising:

a plurality of photo-detectors arranged regularly in row and column directions in a surface of a substrate of a first conductivity type;

a plurality of charge transferring regions of a second conductivity type formed between the photo-detectors of the row direction;

a channel stop layer formed in the surface of the substrate to electrically insulate the photo-detectors from corresponding charge transferring regions; and a reduced doping concentration region formed in the channel stop layer approximately equidistant from two adjacent photo-detectors and laterally offset from the two adjacent photo-detectors, wherein the reduced doping concentration region is completely surrounded by the channel stop region.

8. The CCD as claimed in claim 7, wherein an impurity of the second conductivity type for forming the photo-detectors is implanted in the reduced doping concentration region, so that a potential level of the photo-detectors is lower than a potential level of the channel stop layer.

9. The CCD as claimed in claim 7, wherein no impurities are implanted in the reduced doping concentration region, so that a potential level of the photo-detector is lower than a potential level of the channel stop layer.

* * * * *